(12) United States Patent
Koo

(10) Patent No.: US 7,157,941 B2
(45) Date of Patent: *Jan. 2, 2007

(54) DIFFERENTIAL SWITCHING CIRCUIT AND DIGITAL-TO-ANALOG CONVERTER

(75) Inventor: Hyung-Woan Koo, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/415,465

(22) Filed: May 1, 2006

(65) Prior Publication Data

US 2006/0192590 A1 Aug. 31, 2006

Related U.S. Application Data

(63) Continuation of application No. 11/008,532, filed on Dec. 9, 2004, now Pat. No. 7,064,695.

(30) Foreign Application Priority Data

Dec. 10, 2003 (KR) ............................... 2003-89670

(51) Int. Cl.
*H03K 19/20* (2006.01)
(52) U.S. Cl. ..................... 326/121; 326/119; 326/112; 326/83; 326/81
(58) Field of Classification Search ................ 326/112, 326/119, 121, 83, 81; 327/206, 78, 333
See application file for complete search history.

(56) References Cited

U.S. PATENT DOCUMENTS

| | | | | |
|---|---|---|---|---|
| 4,800,365 A | | 1/1989 | White et al. .................. | 341/119 |
| 5,073,727 A | * | 12/1991 | Shizu .......................... | 326/121 |
| 5,331,322 A | | 7/1994 | Cha et al. .................... | 341/136 |
| 5,872,464 A | * | 2/1999 | Gradinariu ................... | 326/71 |
| 5,945,851 A | | 8/1999 | Tu et al. ....................... | 327/65 |
| 6,005,418 A | * | 12/1999 | Taki ............................ | 326/113 |
| 6,100,830 A | | 8/2000 | Dedic .......................... | 341/136 |
| 6,118,318 A | * | 9/2000 | Fifield et al. ................ | 327/206 |
| 6,147,508 A | * | 11/2000 | Beck et al. ................... | 326/32 |
| 6,160,507 A | | 12/2000 | Carbou et al. .............. | 341/144 |
| 6,271,779 B1 | | 8/2001 | Yokomizo .................... | 341/136 |
| 6,329,940 B1 | | 12/2001 | Dedic .......................... | 341/144 |
| 6,335,633 B1 | * | 1/2002 | Kirsch ......................... | 326/34 |
| 6,340,939 B1 | | 1/2002 | Dedic .......................... | 341/136 |
| 6,433,602 B1 | * | 8/2002 | Lall et al. .................... | 327/205 |
| 6,844,835 B1 | | 1/2005 | Kao ............................. | 341/136 |

(Continued)

FOREIGN PATENT DOCUMENTS

GB 2 356 304 5/2001

(Continued)

*Primary Examiner*—Linh Nguyen
(74) *Attorney, Agent, or Firm*—Mills & Onello LLP

(57) ABSTRACT

A differential switching circuit has a first transistor connected between a first output node and a common node and a second transistor connected between a second output node and the common node. A switching driver generates first and second driving signals in response to an input data signal so as to complementarily drive the first and second transistors. A voltage level of at least one of the first and second driving signals is maintained so as to cause at least one of the first and second transistors to operate in a saturation region regardless of a voltage variation of at least one of the first or second output nodes when the at least one of the first and second transistors is turned on. Output impedance of the device is enhanced because the first and second transistors operate in the saturation region.

10 Claims, 9 Drawing Sheets

U.S. PATENT DOCUMENTS

2003/0043062 A1   3/2003   Dedic et al. ................ 341/144

FOREIGN PATENT DOCUMENTS

JP   09-232931   9/1997

KR   2001-0060276   7/2001

* cited by examiner

DIFFERENTIAL SWITCHING CIRCUIT AND DIGITAL-TO-ANALOG CONVERTER

CROSS-REFERENCE TO RELATED APPLICATION

This application is a continuation application of U.S. Ser. No. 11/008,532, filed Dec. 9, 2004 is now a U.S. Pat. No. 7,064,695 and relies for priority upon Korean Patent Application No. 2003-89670 filed on Dec. 10, 2003, the contents of which are herein incorporated by reference in their entirety.

BACKGROUND OF THE INVENTION

1. Field of the Invention

The present invention relates to a differential switching circuit and a digital-to-analog converter. More particularly, the present invention relates to a circuit capable of enhancing the output impedance of a differential switching circuit for a current cell of a current type digital-to-analog converter.

2. Description of the Related Art

In general, a digital-to-analog converter (DAC) receives n-bit digital signals and converts the received n-bit digital signals into analog signals. The DAC is widely applied to various fields, for example, instrumentation devices, automatic controllers, communication devices, imaging devices, and the like.

Recently, research and development has been applied to a current-steering type DAC suitable for a monolithic integrated circuit in accordance with system on a chip (SOC) technology.

Current-steering type DAC technology can be classified into a binary-weighted type and a segment type according to the type of configuration of a constant current source. In the binary-weighted type DAC, the constant current source is in a binary-weighted configuration so that a decoder is not required, thereby simplifying the switching configuration thereof. However, since the binary-weighted type DAC is known to be susceptible to a glitch error and since the size of the transistor of the constant current source may be increased, the chip size may need to be greatly increased, especially for the transistors corresponding to the most significant bit (MSB).

On the contrary, the segment type DAC may be operated in a switching mode with only constant current sources, so that the segment type DAC offers certain advantages such as a simplified operation, monotonicity, high-speed operation, and is operable without a glitch error, etc. However, since the segment type DAC requires a decoder and $2^n-1$ constant current sources when processing n bits, the configuration of the associated switching circuit is complex and the chip size for designing an integrated circuit may be increased.

In view of the above, a hybrid technique that applies both the binary-weighted method and the segment method to a least significant bit (LSB) and the most significant bit (MSB) of the device, respectively, has been developed. The current-steering type DAC includes a current cell for the constant current source. The current cell includes a differential switching circuit for switching the constant current signal in response to an input digital data signal. An example of a differential switching circuit is disclosed in Korean Laid-Open Patent Application No. 2001-60276 and U.S. Pat. No. 6,100,830.

FIG. 1 is a circuit diagram showing a conventional differential switching circuit. Referring to FIG. 1, a conventional differential switching circuit includes a pair of transistors $Q_1$ and $Q_2$ in a common source configuration that are complementarily switched. A plurality of differential switching circuits is connected to a pair of output terminals POUT and NOUT in parallel. Thus, a current signal $(I_t = \Sigma I_u)$ that is the sum of unit current signals $I_u$ provided from a differential switching circuit of which a transistor is turned on among the differential switching circuits flows through an output load $R_L$ connected to the output terminal $P_{OUT}$, so that a voltage difference of an output voltage $V_p(=R_{LP} \times I_t)$ is applied to an output terminal of the active transistors of the differential switching circuits.

Responsive to an input data value, the voltage signal of the output terminal POUT is varied from 0V to $V_{FS}$ (full-scale voltage). When a level of the voltage signal at the output terminal increases to the full-scale voltage, transistor Q1 or Q2 operates in the active region (or linear region) after departing from the saturation region, thereby lowering the output impedance of the differential switching circuits in view of the output terminal.

As a result, when the output impedance of the differential switching circuit is lowered, an error may occur in an output current due to variation of the output voltage, thereby lowering the accuracy of the DAC.

SUMMARY OF THE INVENTION

The present invention provides a differential switching circuit capable of enhancing output impedance thereof.

The present invention also provides a digital-to-analog converter having improved accuracy.

In one aspect of the present invention, a differential switching circuit includes a first transistor coupled between a first output node and a common node, a second transistor coupled between a second output node and the common node, and a switching driver configured to generate a first driving signal and a second driving signal so as to complementarily drive the first and second transistors in response to an input data signal. When at least one of the first and second transistors is turned on, a voltage level of at least one of the first and second driving signals is maintained so as to cause at least one of the first and second transistors to operate in a saturation region regardless of a voltage variation in at least one of the first and second output node.

The switching driver includes a first driver configured to generate the first driving signal in response to the input data signal and configured to apply the first driving signal to a control electrode of the first transistor, and a second driver configured to generate the second driving signal in response to an inverted input data signal that is in opposite phase to the input data signal and configured to apply the second driving signal to a control electrode of the second transistor. Each of the first and second drivers includes a dynamic inverter.

The dynamic inverter includes a third transistor coupled between a first power voltage and the control electrode of the first transistor or the control electrode of the second transistor and configured to receive the input data signal or the inverted input data signal through a control electrode thereof, a fourth transistor coupled between the first output node and the control electrode of the first transistor or the control electrode of the second transistor and configured to receive the input data signal or the inverted input data signal through a control electrode thereof, and a fifth transistor coupled between the first output node and a second power voltage, the fifth transistor having a control electrode coupled to the control electrode of the first transistor or the control electrode of the second transistor.

Each of the first, second and third transistors includes a PMOS transistor, and each of the fourth and fifth transistors includes an NMOS transistor.

The differential switching circuit further includes a MOS capacitor coupled between the first power voltage and the control electrode of the first transistor or the control electrode of the second transistor and configured to prevent an electric potential at the control electrode of the first transistor or the control electrode of the second transistor from being lowered due to a leakage current when a frequency of the input data signal is lower than a predetermined frequency.

The differential switching circuit further includes a constant current source coupled between the first power voltage and the common node.

The constant current source includes sixth and seventh transistors coupled in series between the first power voltage and the common node.

In another aspect of the present invention, a digital-to-analog converter includes an input part configured to receive and store a digital data signal, a decoder configured to decode the digital data signal from the input part so as to generate a switching driving data signal corresponding to the decoded digital data signal, a current cell array that includes a pair of transistors having common source configuration, which are selectively switched in response to the switching driving data signal to provide a unit current signal to an output terminal of a pair of output terminals, and an output part. The current cell array is configured to control the turned-on transistor of the transistor pair having common source configuration to operate in a saturation region regardless of a voltage variation at the output terminal of the turned-on transistor when one transistor of the commonly coupled transistor pair. The output part is configured to output an analog signal corresponding to the digital data signal based on a difference between a sum of a unit current signal provided through one output terminal of each of current cells of the current cell array and a sum of unit current signals provided through the other output terminal of each of the current cells of the current cell array.

Each of the current cells includes a pair of transistors, which have common source configuration, having a first transistor coupled between the one output terminal and a common node and a second transistor coupled between the other output terminal and the common node, a first driver configured to generate a first driving signal to apply the first driving signal to a control electrode of the first transistor so as to complementarily drive the first and second transistors in response to the switching driving data signal, and a second driver configured to generate a second driving signal in response to an inverted input signal from the switching driving data signal and configured to apply the second driving signal to a control electrode of the second transistor. Each of the first and second drivers includes a third transistor coupled between a first power voltage and the control electrode of the first or second transistor and configured to receive the switching driving data signal or the inverted data signal through a control electrode thereof, a fourth transistor coupled between a first node and the control electrode of the first or second transistor and configured to receive the switching driving data signal or the inverted data signal through a control electrode thereof, and a fifth transistor coupled between the first node and a second power voltage, the fifth transistor having a control electrode coupled to the control electrode of the first or second transistor.

The digital-to-analog converter converts a least significant bit (LSB) and a most significant bit (MSB) by a binary-weighted current cell method and a segment current cell method, respectively. In one embodiment, the decoder comprises a thermometer decoder.

BRIEF DESCRIPTION OF THE DRAWINGS

The above and-other advantages of the present invention will become readily apparent by reference to the following detailed description when considered in conjunction with the accompanying drawings wherein.

DETAILED DESCRIPTION OF PREFERRED EMBODIMENTS

Hereinafter, the present invention will be explained in detail with reference to the accompanying drawings.

Figure 1:
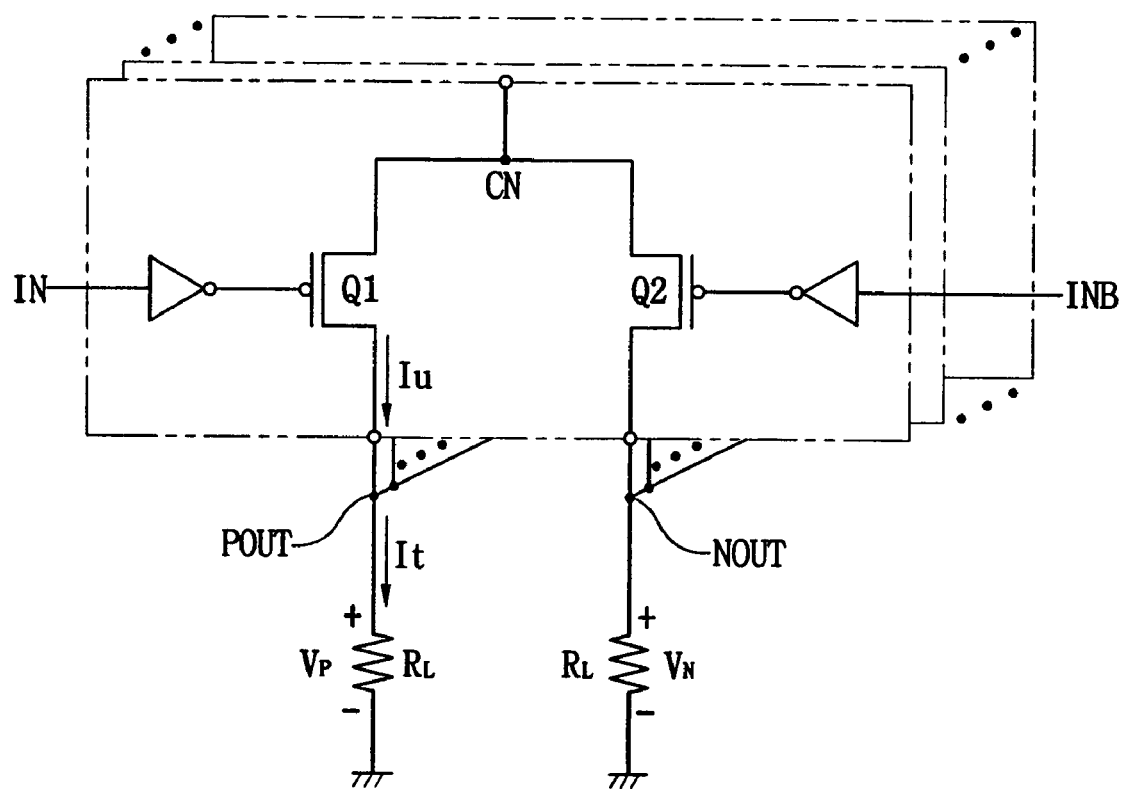
FIG. 1 is a circuit diagram of a conventional differential switching circuit.
Figure 2:
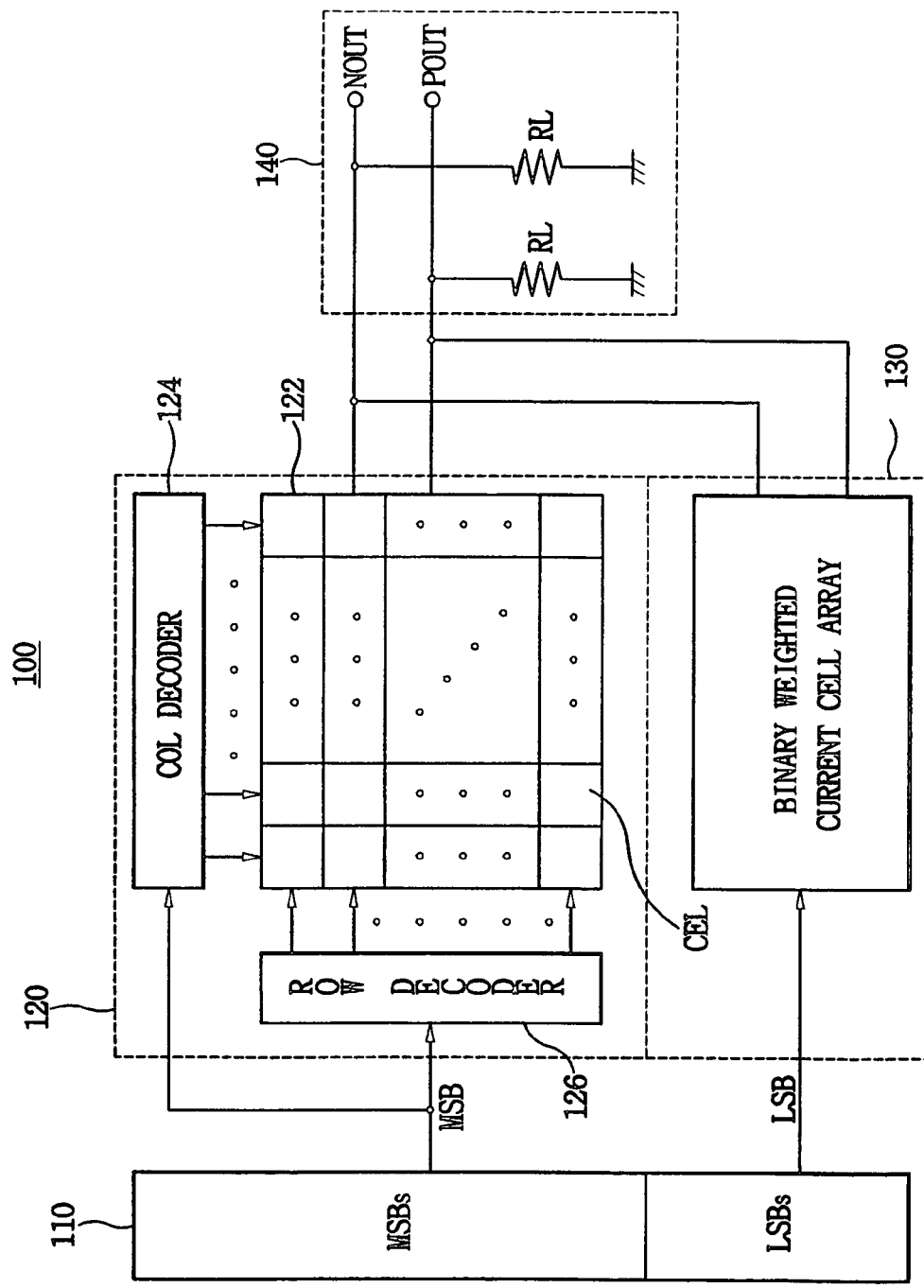
FIG. 2 is a block diagram of a digital-to-analog converter according to an exemplary embodiment of the present invention.

FIG. 2 is a block diagram showing a digital-to-analog converter according to an exemplary embodiment of the present invention. In this exemplary embodiment, a 10-bit digital-to-analog converter will be described in detail. However, the principles of the present invention apply equally well to DACs having other numbers of input bits.

Referring to FIG. 2, a 10-bit digital-to-analog converter 100 includes an input part 110, a segment type digital-to-analog converter (segment DAC) part 120, a binary-weighted type digital-to-analog (binary-weighted DAC) part 130 and an output part 140. The segment DAC part 120 and the binary-weighted DAC part 130 receive the upper 5-bits b9, b8, b7, b6 and b5 and the lower 5-bits b4, b3, b2, b1 and b0, respectively, of the 10-bit-wide input data signal.

The segment DAC part 120 includes a current cell array 122, a column decoder 124 and a row decoder 126.

Figure 3:
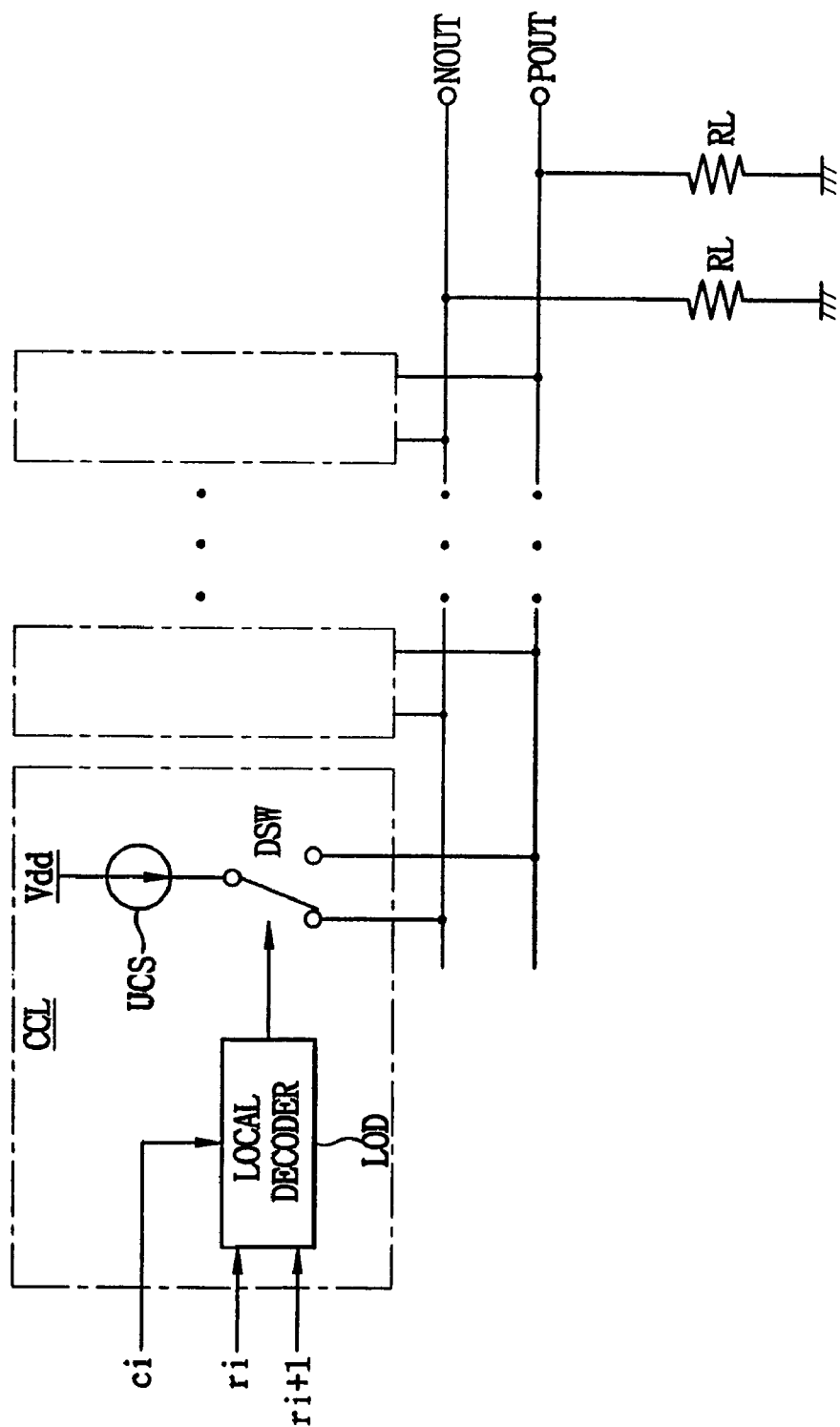
FIG. 3 is a circuit diagram of a current cell array of the segment DAC component shown in FIG. 2.
Figure 4:
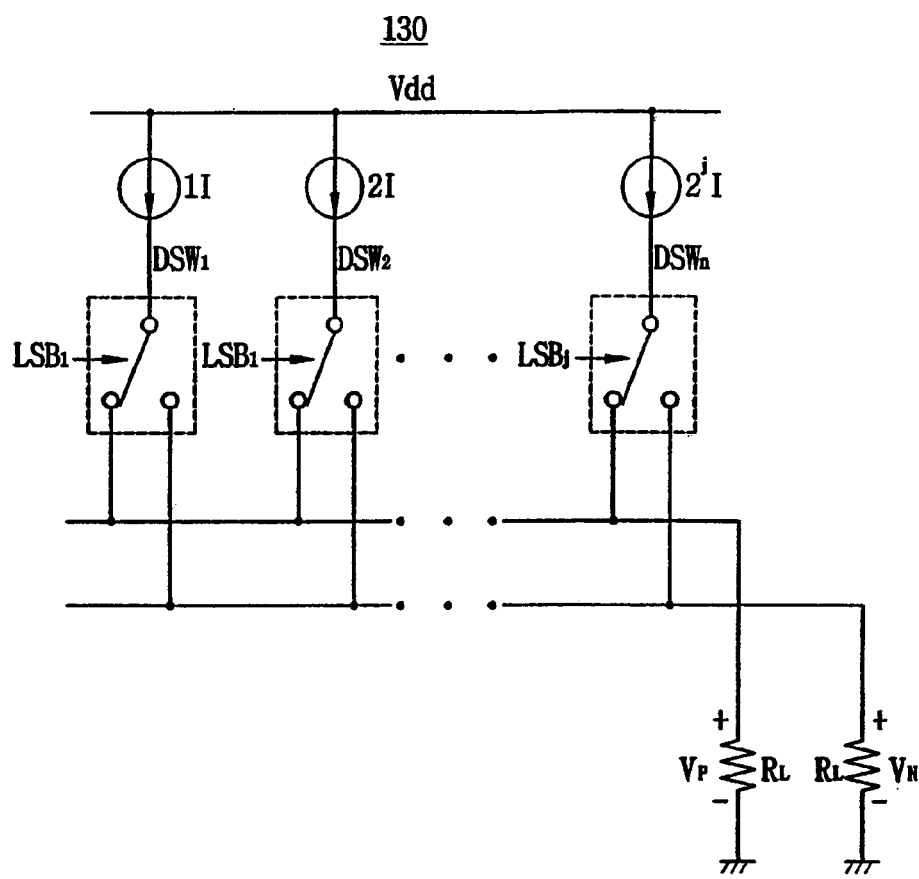
FIG. 4 is a circuit diagram of a current cell array of the binary-weighted DAC component shown in FIG. 2.

FIG. 3 is a circuit diagram of the current cell array 122 of the segment DAC part 120 shown in FIG. 2. FIG. 4 is a circuit diagram showing a current cell array of the binary-weighted DAC part 130 shown in FIG. 2.

Referring to FIG. 3, each of the current cells CCL of the current cell array 122 includes a local decoder LOD that decodes a column address signal ci provided from the column decoder 124 and a row address signal ri and ri+1 provided from the row decoder 126, a unit current source UCS and a differential switch DSW. The differential switch DSW is switched in response to an output of the local decoder LOD so as to allow a unit current to be alternatively applied to a pair of output terminals. The column and row decoders are referred to as a global decoder with respect to the local decoder LOD, and the global decoder encodes input binary data to output a signal referred to as a "thermometer code signal" as an address signal. The thermometer decoder and the current cell array have been disclosed in U.S. Pat. No. 6,236,346 and No. 6,163,283 in detail, the contents of which are incorporated herein by reference, and thus the detailed descriptions of the thermometer decoder and the current cell array will be omitted in the present specification.

As shown in FIG. 4, the binary-weighted DAC part 126 includes binary-weighted current sources 1I, 2I, . . . , $2^jI$ and differential switches DSW1, DSW2, . . . , $DSW_j$. Each of differential switches DSW1, DSW2, . . . , $DSW_j$ is switched in response to each of corresponding lower bits LSB1, LSB2, . . . , $LSB_j$ of the input signal.

When the segment DAC part 124 and the binary-weighted DAC part 126 of the hybrid-type DAC are configured as described above, the chip size for the DAC circuit, for example, the segment DAC part 124, the binary-weighted DAC part 126, etc., is minimized.

Both of the segment DAC part 124 and the binary-weighted DAC part 126 include differential switches. The differential switch according to the present invention is configured so as to enhance the output impedance of the differential switch.

<PMOS Differential Switch>

Figure 6:
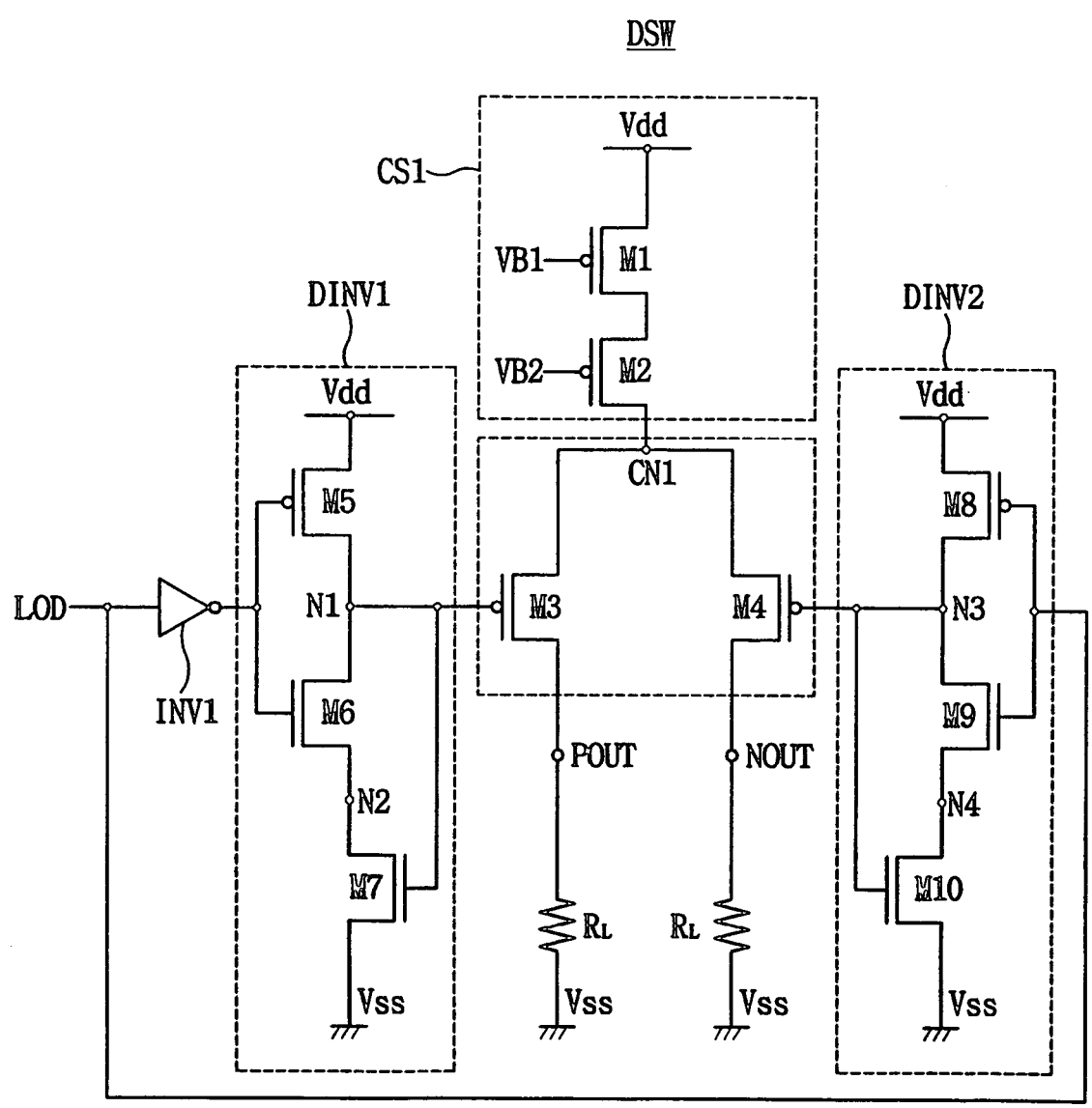
FIG. 6 is a circuit diagram of a PMOS differential switch according to an exemplary embodiment of the present invention.

FIG. 6 is a circuit diagram of a PMOS differential switch DSW according to an exemplary embodiment of the present invention.

Referring to FIG. 6, a PMOS differential switch includes a pair of transistors M3 and M4 having a common source configuration, a first dynamic inverter DINV1, a second dynamic inverter DINV2 and a first inverter INV1. The first and second dynamic inverters DINV1 and DINV2 form a switching driver.

A current source CS1 includes a first PMOS transistor M1 and a second PMOS transistor M2 that are connected between a power voltage Vdd and a common node CN1 in series. The first PMOS transistor M1 and the second PMOS transistor M2 are operated substantially in a saturation region because the first PMOS transistor M1 receives a first bias voltage VB1 through a gate thereof and the second PMOS transistor M2 receives a second bias voltage VB2 through a gate thereof. Thus, the current source CS1 provides a constant current that is decided by the first and second bias voltages VB1 and VB2 to the common node CN1. The current source CS1 having the first and second PMOS transistors M1 and M2 connected in series may enhance output impedance in comparison with a current source configured by only one transistor, thereby minimizing variation of output current caused by variation of output voltage.

The transistor pair having a common source configuration includes a third PMOS transistor M3 and a fourth PMOS transistor M4. The third PMOS transistor M3 includes a drain connected to the output terminal $P_{OUT}$, a source connected to the common node CN1 and a gate connected to the first dynamic inverter DINV1. The fourth PMOS transistor M4 includes a drain connected to the output terminal $N_{OUT}$, a source connected to the common node CN1 and a gate connected to the second dynamic inverter DINV2.

Thus, the third and fourth PMOS transistors M3 and M4 are complementarily switched so as to alternatively provide a constant current signal to the output terminals $P_{OUT}$ and $N_{OUT}$, which is applied to the common node CN1.

The first dynamic inverter DINV1 includes a fifth PMOS transistor M5, a sixth NMOS transistor M6 and a seventh NMOS transistor M7. The fifth PMOS transistor M5 includes a source connected to the power voltage Vdd, a drain connected to a first node N1 and a gate connected to an output of the first inverter INV1. The sixth NMOS transistor M6 includes a drain connected to the first node N1, a source connected to a second node N2 and a gate connected to the output of the first inverter INV1. The seventh NMOS transistor M7 includes a drain connected to the second node N2, a source connected to a ground voltage Vss and a gate connected to the first node N1. The first node N1 connected to the gate of the third PMOS transistor M3 operates as an output node of the first dynamic inverter DINV1.

The second dynamic inverter DINV2 includes an eighth PMOS transistor M8, a ninth NMOS transistor M9 and a tenth NMOS transistor M10. The eighth PMOS transistor M8 includes a source connected to the power voltage Vdd, a drain connected to a third node N3 and a gate connected to an output of the local decoder LOD. The ninth NMOS transistor M9 includes a drain connected to the third node N3, a source connected to a fourth node N4 and a gate connected to the output of the local decoder LOD. The tenth NMOS transistor M10 includes a drain connected to the fourth node N4, a source connected to the ground voltage Vss and a gate connected to the third node N3.

Figure 5:
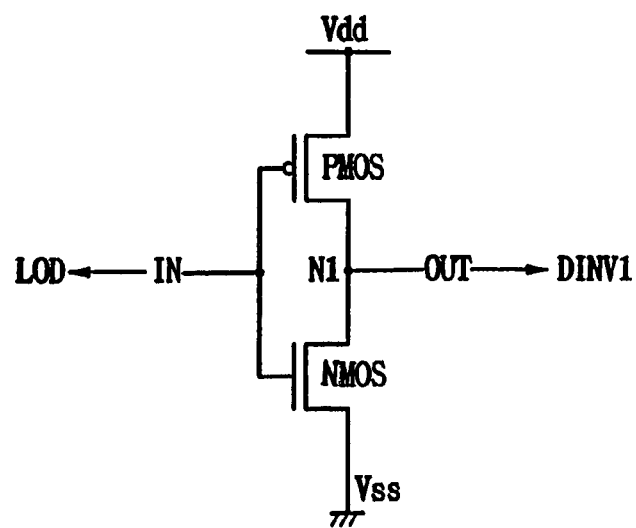
FIG. 5 is a circuit diagram of an inverter of the embodiment of FIG. 6.

FIG. 5 is a circuit diagram of the inverter shown in FIG. 6. Referring to FIG. 5, the first inverter INV1 is configured by a complementary metal-oxide-semiconductor (CMOS) inverter having a PMOS transistor and an NMOS transistor. The first inverter INV1 includes an input connected to an output of the local decoder LOD.

The PMOS differential switch may be operated in the saturation region without concern with regard to variation of the voltage of the output terminals POUT and NOUT because the PMOS differential switch is operated by the first and second dynamic inverters DINV1 and DINV2.

The third PMOS transistor M3 has a condition of operation in the saturation region as follows. The condition of saturation region with respect to a conventional MOS transistor is represented by the following expression 1.

$V_{sat} > V_{GS} - V_t$ <Expression 1>

In expression 1, $V_t$ indicates a threshold voltage of the MOS transistor. Thus, when expression 1 is applied to the third PMOS transistor M3, the following expression 2 is obtained.

$V_{sat} > V_{GS3} - V_{tp}$ <Expression 2>

In expression 2, since $V_{GS3}$ is equal to $V_{CN} - V_{N1}$, the expression 2 is represented by the following expression 3.

$V_{sat} > (V_{CN} - V_{N1}) - V_{tp}$ <Expression 3>

In expression 3, if a first over-drive voltage $V_{od1}$ of the first PMOS transistor M1 and a second over-drive voltage $V_{od2}$ of the second PMOS transistor M2 are equal to each other ($V_{od1} = V_{od2}$), $V_{CN1}$ may be represented by $V_{dd} - 2V_{od}$. Thus, the expression 3 is represented by the following expression 4.

$V_{sat} > ((V_{dd} - 2V_{od}) - V_{N1}) - V_{tp}$ <Expression 4>

In the case where the output voltage of the output terminal $P_{OUT}$ and the full scale are VP and $V_{FS}$, respectively, a source-drain voltage of the third PMOS transistor M3 in the saturation region is represented by the following expression 5.

$$V_{DS\,sat} = V_{dd} - 2V_{od} - V_{FS} \qquad \text{<Expression 5>}$$

Thus, when expression 5 is substituted into expression 4, the following expression 6 is obtained.

$$V_{dd} - 2V_{od} - V_{FS} > V_{dd} - 2V_{od} - V_{N1} - V_{tp} \qquad \text{<Expression 6>}$$

The following expression 7 can be obtained from the expression 6.

$$V_{FS} < V_{N1} + V_{tp} \qquad \text{<Expression 7>}$$

Referring to expression 7, $V_{FS}$ and $V_{tp}$ cannot be varied, since $V_{FS}$ indicating the full-scale level is a set value and since $V_{tp}$ is a process parameter. Thus, only the parameter "$V_{N1}$" indicating a gate voltage of the third PMOS transistor M3 can be varied.

In a DAC that converts digital image data into analog image data, an image signal has a voltage level between about 0 volts and about 1 volt. Therefore, when the output voltage is full-scale level, VFS is about 1 volt and Vtp of a PMOS transistor is about 0.7 volts. So, an operation region of the third PMOS transistor M3 is changed from the saturation region to the active region (or linear region) as the output voltage level increases from 0 volts to 1 volt when a voltage level of $V_{N1}$ is "0".

Since the third PMOS transistor M3 is operated in the saturation region in the case where the output voltage of $V_{N1}$ is $0 \leq V_P < V_{tp}$, the output impedance of the differential switch DSW is represented by the following expression 8.

$$Z_{out,\,sat} = g_{m3} \times r_{o3} \times g_{m2} \times r_{o2} \times r_{o1} \qquad \text{<Expression 8>}$$

In the expression 8, $g_{m3}$, $r_{o3}$, $g_{m2}$, $r_{o2}$ and $r_{o1}$ indicate a transconductance of the third PMOS transistor M3, the output impedance of the third PMOS transistor M3, a transconductance of the second PMOS transistor M2, an output impedance of the second PMOS transistor M2 and an output impedance of the first PMOS transistor M1, respectively.

However, since the third PMOS transistor M3 is operated in the active region in the case where $V_{tp} < V_P \leq V_{FS}$, the output impedance of the differential switch DSW is represented by the following expression 9.

$$Z_{out,\,lin} = g_{m2} \times r_{o2} \times r_{o1} + R_{on3} \qquad \text{<Expression 9>}$$

In the expression 9, $R_{on3}$ indicates a turn-on resistance of the third PMOS transistor M3 in the active region.

As a result, the output impedance decreases and the output current varies due to change of the operation region of the third PMOS transistor M3 into the active region, thereby lowering the accuracy of the output voltage $V_p$.

Therefore, the voltage level of $V_{N1}$ must satisfy a turn-on condition of the third PMOS transistor M3 and allow the third PMOS transistor M3 to operate in the saturation region without concerning variation of the output voltage $V_p$.

When the third PMOS transistor M3 is turned on, an approach that maintains $V_{N1}$ at a level greater than $V_{FS} - V_{tp}$, or lowers $V_{CN1}$, may be provided. However, the method that lowers $V_{CN1}$ is impossible or impractical in reality because the output voltage is limited.

In the approach that maintains $V_{N1}$ at a level greater than a certain value when the third PMOS transistor M3 is turned on, an inner voltage generating circuit that generates a certain voltage may be provided to accomplish this. However, since this approach further requires an additional capacitor for removing switching noise in the voltage generating circuit, chip size, power consumption and number of pins may increase in the resulting device.

Accordingly, the differential switch according to the exemplary embodiment of the present invention includes the first and second dynamic inverters DINV1 and DINV2 so as to maintain the voltage value $V_{N1}$ over the certain value.

In the first dynamic inverter DINV1, the fifth PMOS transistor M5 and the seventh NMOS transistor M7 are turned on and the sixth NMOS transistor M6 is turned off when the third PMOS transistor M3 is turned off, so that the voltage level $V_{N1}$ of the first node N1 rises to the voltage level $V_{dd}$. Also, when the third PMOS transistor M3 is turned on, the fifth PMOS transistor M5 is turned off and the sixth and seventh NMOS transistors M6 and M7 are turned on so that the voltage level $V_{N1}$ of the first node N1 falls from the voltage level $V_{dd}$ to the ground voltage level $V_{ss}$. The voltage level $V_{N1}$ of the first node N1 thus maintained in a certain value because the seventh NMOS transistor M7 is turned off due to a weak inversion state when the voltage level $V_{N1}$ falls under the threshold voltage of the seventh NMOS transistor M7.

Figure 7:
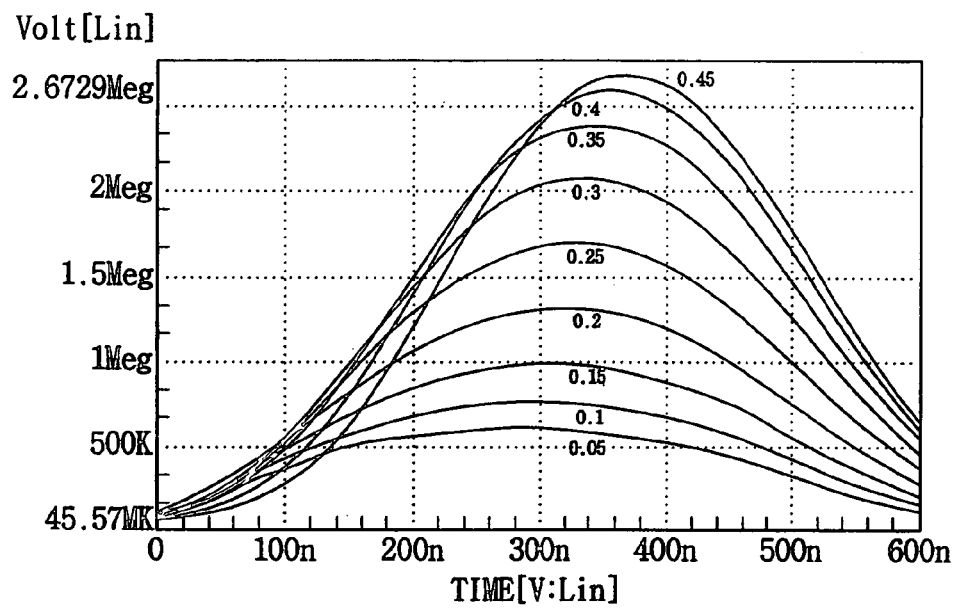
FIGS. 7 and 8 are graphs of the variation of output impedance in accordance with a driving voltage of a third PMOS transistor of a PMOS differential switch according to an exemplary embodiment of the present invention.
Figure 8:
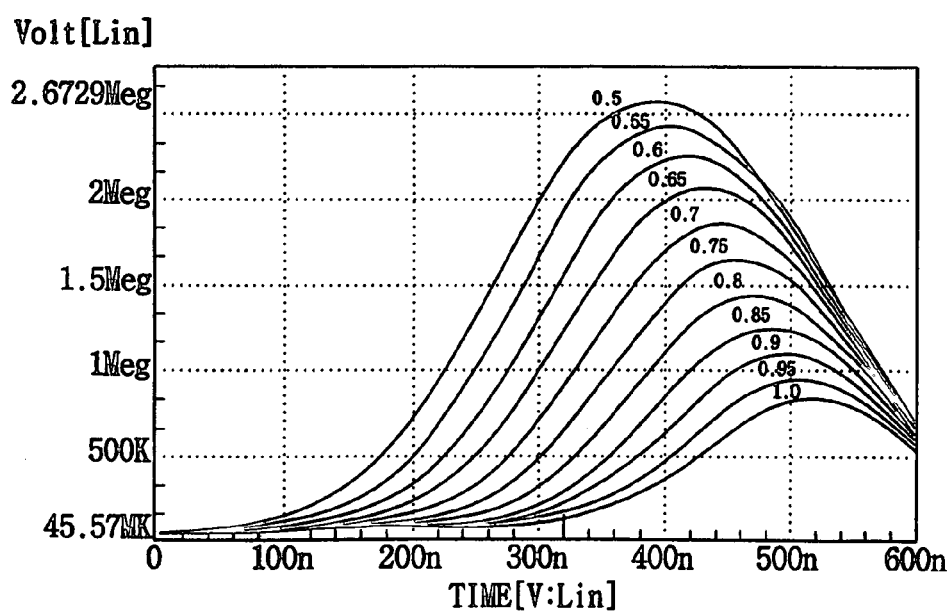

FIGS. 7 and 8 are graphs illustrating variation in output impedance in accordance with a driving voltage of a third PMOS transistor of a PMOS differential switch according to an exemplary embodiment of the present invention.

In FIG. 7, the output impedance in view of the output terminal gradually increases when the voltage level of $V_{N1}$ is changed from about 0.05 volts to about 0.45 volts.

In FIG. 8, the output impedance in view of the output terminal gradually decreases when the voltage level of $V_{N1}$ is changed from about 0.5 volts to about 1.0 volt.

Based on the simulation result, when the output voltage $V_{N1}$ of the first node N1 falls under about 0.3 volts, the third PMOS transistor M3 is operated in the active region, and when the output voltage $V_{N1}$ of the first node N1 rises over about 0.65 volts, the turn-on condition of the third PMOS transistor M3 is deteriorated, thereby lowering the output impedance.

Figure 9:
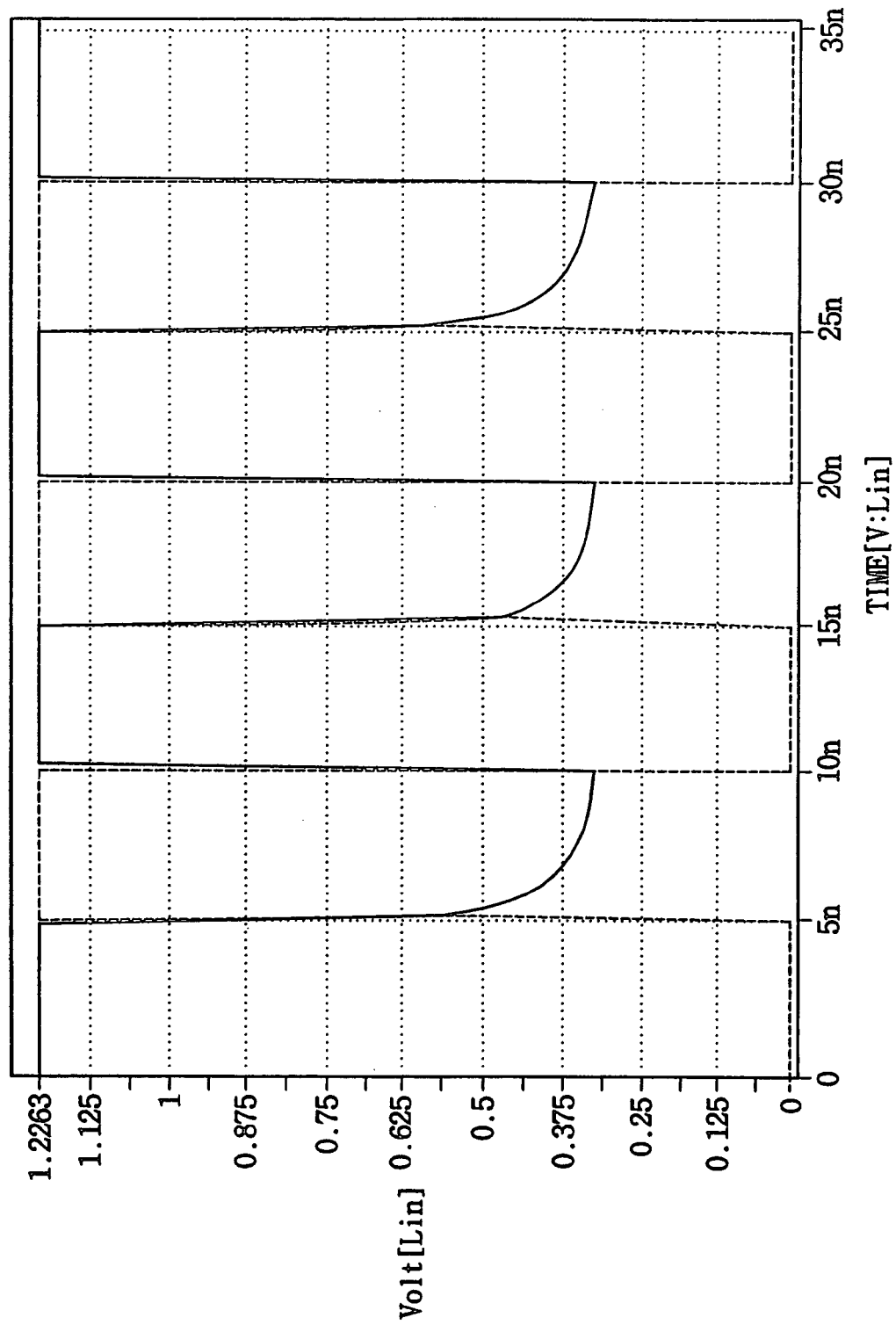
FIG. 9 is wave diagram of an input waveform and an output waveform of a dynamic inverter according to an exemplary embodiment of the present invention.

FIG. 9 is a wave diagram of an input waveform and an output waveform of a dynamic inverter according to an exemplary embodiment of the present invention. Referring to FIG. 9, when an input signal (dotted line) is varied with a period of about 100 MHz between about 0 volts and about 1.226 volts, an output signal (solid line) is periodically varied between about 1.226 volts and about 0.32 volts. That is, the output signal has a voltage value of about 0.32 volts when in the low state.

When the period of signal variation of the first dynamic inverter DINV1 is under 5 MHz, the output voltage $V_{N1}$ of the first node N1 continuously falls under the certain value due to a spontaneous discharge. As a result, the operation region of the third PMOS transistor M3 is changed from the saturation region to the active region, thereby lowering the output impedance.

In order to prevent the output impedance from being lowered, a first MOS capacitor MC1 may be connected between the power voltage $V_{dd}$ and the first node N1.

Figure 10:
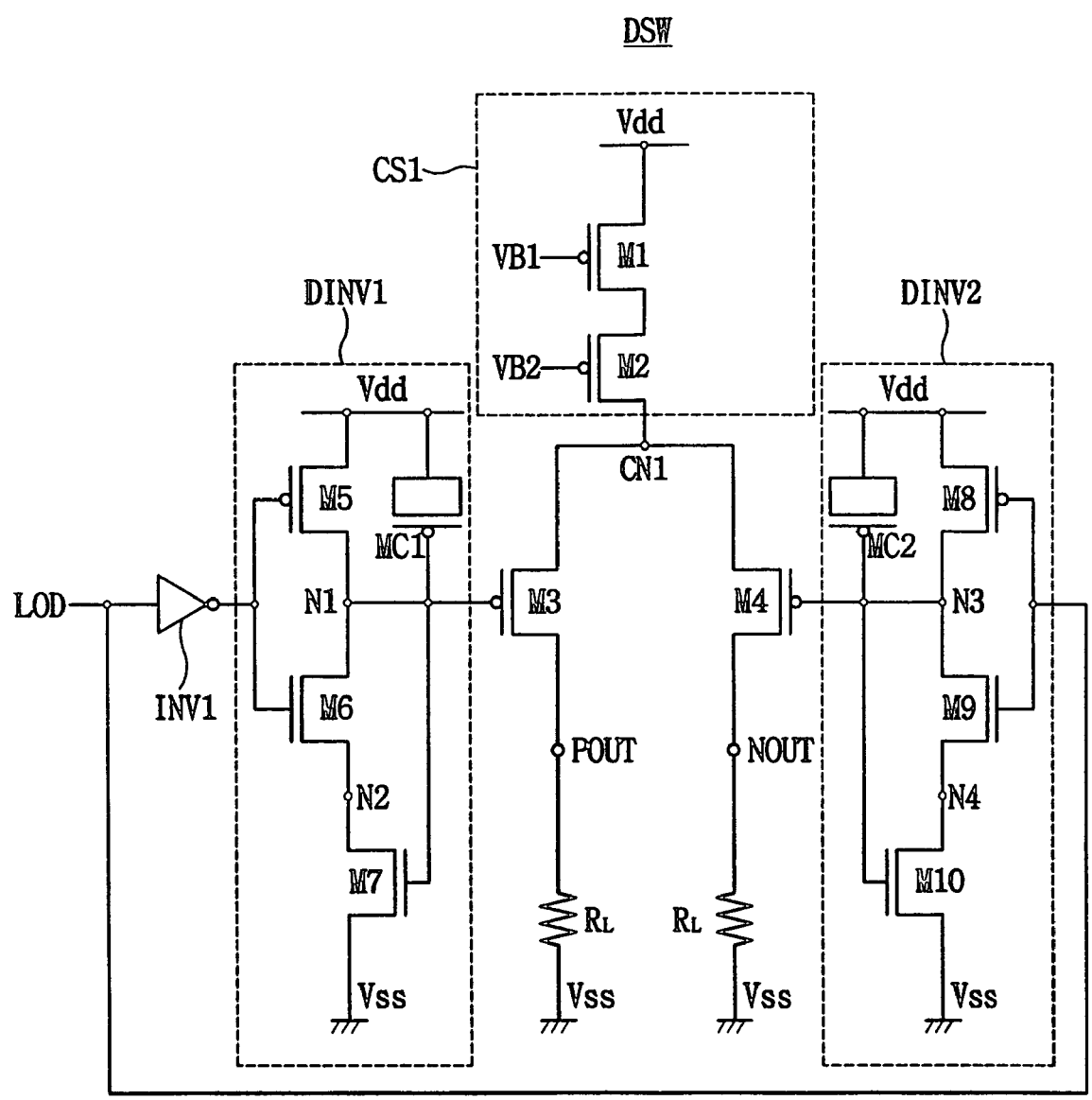
FIG. 10 is a circuit diagram of a PMOS differential switch according to another exemplary embodiment of the present invention.

FIG. 10 is a circuit diagram showing a PMOS differential switch according to another exemplary embodiment of the present invention.

Referring to FIG. 10, the first MOS capacitor MC1 includes a PMOS transistor having a source connected to the power voltage $V_{dd}$, a drain commonly connected to the power voltage $V_{dd}$ with the source and a gate connected to the first node N1.

Thus, the voltage level of the first node N1 may be uniformly maintained because an electric charge spontaneously discharged from the first node N1 is provided to the first node N1 through the first MOS capacitor MC1. That is, when the first dynamic inverter DINV1 is operated at a high speed, for example over 5 MHz, the first dynamic inverter DINV1 in this example, does not require the first MOS capacitor MC1

In the same way, the second dynamic inverter DINV2 may include a PMOS transistor so as to prevent the output impedance from being lowered.

<NMOS Differential Switch>

Figure 11:
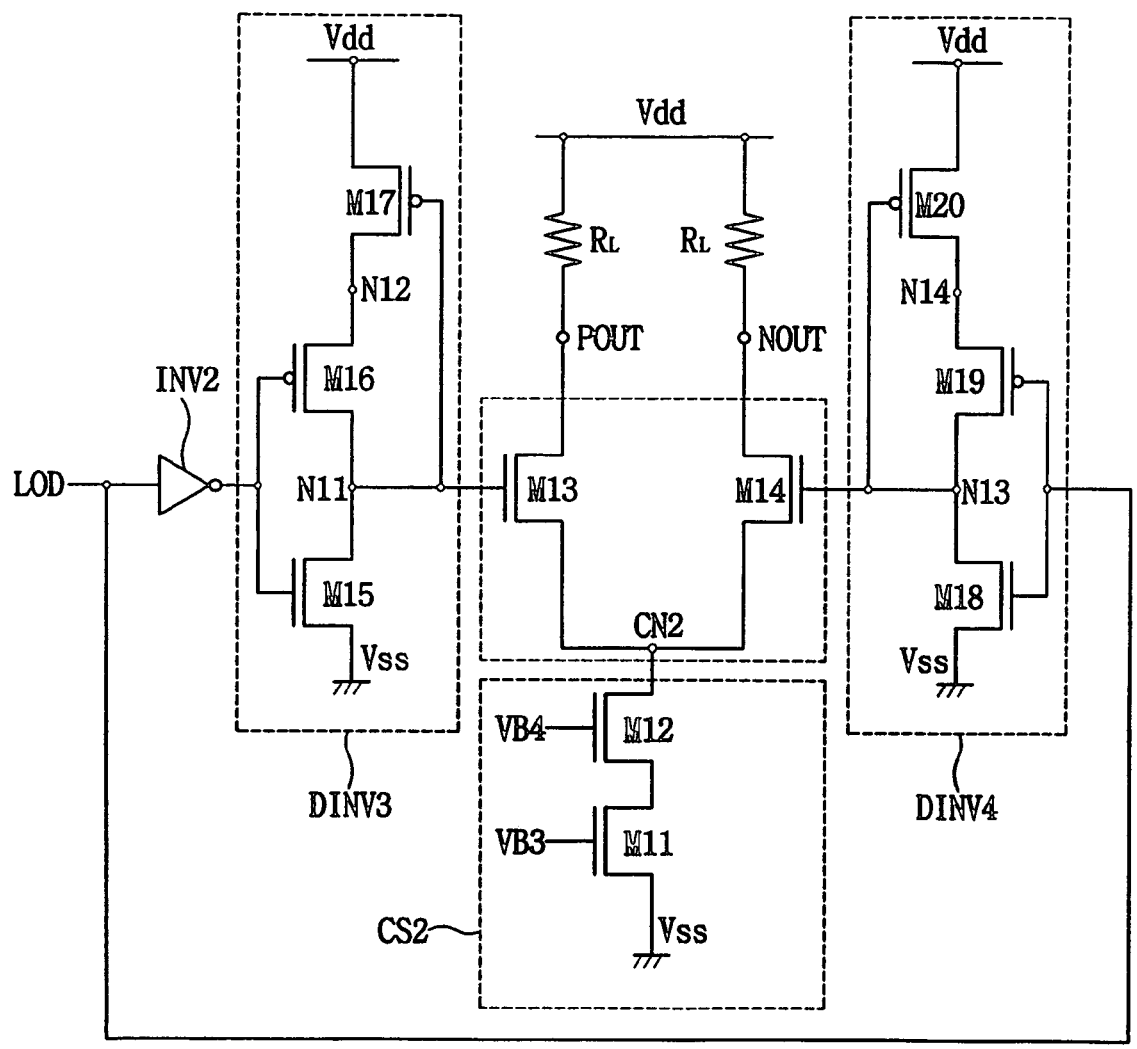
FIG. 11 is a circuit diagram of an NMOS differential switch according to an exemplary embodiment of the present invention.

FIG. 11 is a circuit diagram showing an NMOS differential switch according to an exemplary embodiment of the present invention.

Referring to FIG. 11, an NMOS differential switch includes a pair of transistors M13 and M14 having common source configuration, a third dynamic inverter DINV3, a fourth dynamic inverter DINV4 and a second inverter INV2. The third and fourth dynamic inverters DINV3 and DINV4 form a switching driver.

A current source CS2 includes an eleventh NMOS transistor M11 and a twelfth NMOS transistor M12 that are connected between a ground voltage $V_{ss}$ and a common node CN2 in series. The eleventh NMOS transistor M11 and the twelfth NMOS transistor M12 are operated substantially in the saturation region because the eleventh NMOS transistor M11 receives a third bias voltage VB3 through a gate thereof and the twelfth NMOS transistor M12 receives a fourth bias voltage VB4 through a gate thereof. Thus, the current source CS2 provides a constant current, the value of which is determined by the values of third and fourth bias voltages VB3 and VB4 to the common node CN2. The current source CS2 having the eleventh and twelfth NMOS transistors M11 and M12 connected in series enhance output impedance in comparison with a current source configured by only one transistor, thereby minimizing variation of output current caused by variation of output voltage.

The transistor pair having a common source configuration includes a thirteenth NMOS transistor M13 and a fourteenth NMOS transistor M14. The thirteenth NMOS transistor M13 includes a drain connected to the output terminal $P_{OUT}$, a source connected to the common node CN2 and a gate connected to the third dynamic inverter DINV3. The fourteenth NMOS transistor M14 includes a drain connected to the output terminal $N_{OUT}$, a source connected to the common node CN2 and a gate connected to the fourth dynamic inverter DINV4. Thus, the thirteenth and fourteenth NMOS transistors M13 and M14 are complementarily switched so as to alternatively provide a constant current signal to the output terminals $P_{OUT}$ and $N_{OUT}$, which is applied to the common node CN2.

The third dynamic inverter DINV3 includes a fifteenth NMOS transistor M15, a sixteenth PMOS transistor M16 and a seventeenth PMOS transistor M17. The fifteenth NMOS transistor M15 includes a source connected to the ground voltage Vss, a drain connected to a node N11 and a gate connected to an output of the second inverter INV2. The sixteenth PMOS transistor M16 includes a drain connected to the node N11, a source connected to a node N12 and a gate connected to the output of the second inverter INV2. The seventeenth PMOS transistor M17 includes a drain connected to the node N12, a source connected to a power voltage Vdd and a gate connected to the node N11. The node N11 connected to the gate of the thirteenth NMOS transistor M13 acts as an output node of the third dynamic inverter DINV3.

The fourth dynamic inverter DINV4 includes an eighteenth NMOS transistor M18, a nineteenth PMOS transistor M19 and a twentieth PMOS transistor M20. The eighteenth NMOS transistor M18 includes a source connected to the ground voltage Vss, a drain connected to a node N13 and a gate connected to an output of the local decoder LOD. The nineteenth PMOS transistor M19 includes a drain connected to the node N13, a source connected to a node N4 and a gate connected to the output of the local decoder LOD. The twentieth PMOS transistor M20 includes a drain connected to the node N4, a source connected to the power voltage Vdd and a gate connected to the node N13.

As shown in FIG. 5, the second inverter INV2 is configured by a complementary metal-oxide-semiconductor (CMOS) inverter having a PMOS transistor and an NMOS transistor. The second inverter INV2 includes an input connected to an output of the local decoder LOD.

The NMOS differential switch is operated in the saturation region without concern over the variation of the voltage level at the output terminals $P_{OUT}$ and $N_{OUT}$ because the NMOS differential switch is operated by the third and fourth dynamic inverters DINV3 and DINV4.

The thirteenth NMOS transistor M13 has a condition of saturation region as follows. When the expression 1 is applied to the thirteenth NMOS transistor M13, the following expression 10 may be obtained.

$$V_{sat} > V_{GS13} - V_{tn} \qquad \text{<Expression 10>}$$

In expression 10, since $V_{GS13}$ is equal to $V_{N11} - V_{CN2}$ and $V_{tn}$ is a threshold voltage of the thirteenth NMOS transistor M13, expression 10 is represented by the following expression 11.

$$V_{sat} > (V_{N11} - V_{CN2}) - V_{tn} \qquad \text{<Expression 11>}$$

In expression 11, if an eleventh over-drive voltage $V_{od11}$ of the eleventh NMOS transistor M11 and a twelfth over-drive voltage $V_{od12}$ of the twelfth NMOS transistor M12 are equal to each other ($V_{od11} = V_{od12}$), $V_{CN2}$ can be represented by $2V_{od}$. Thus, the expression 11 is represented by the following expression 12.

$$V_{sat} > ((V_{N11} - 2V_{od}) - V_{tn} \qquad \text{<Expression 12>}$$

In the case where the output voltage of the output terminal $P_{OUT}$ and the full-scale are VP and $V_{P,FS}$, respectively, a source-drain voltage of the thirteenth NMOS transistor M3 in the saturation region is represented by the following expression 13.

$$V_{DS13\,sat} = V_{P,FS} - V_{CN2} = V_{P,FS} - 2V_{od} \qquad \text{<Expression 13>}$$

Thus, when expression 13 is substituted into expression 12, the following expression 14 is obtained.

$$V_{P,FS} - 2V_{od} > V_{N11} - 2V_{od} - V_{tn} \qquad \text{<Expression 14>}$$

The following expression 15 may be obtained from expression 14.

$$V_{P,FS} > V_{N11} - V_{tn} \qquad \text{<Expression 15>}$$

Referring to expression 15, it is impractical or impossible to vary $V_{P,FS}$ and $V_{tn}$ because $V_{P,FS}$ indicates the full-scale level of an analog output signal and $V_{tn}$ is a process parameter of the thirteenth NMOS transistor M13. Thus, only the parameter "$V_{N11}$" indicating a gate voltage of the thirteenth NMOS transistor M3 can be varied.

In the case where the power voltage Vdd is about 3.3 volts, the output voltage level $V_{P,FS}$ is about 2.3 volts because the full-scale level is 1 volt. The voltage level $V_{tn}$ of an NMOS transistor is about 0.7 volts. Since the thirteenth NMOS transistor M13 is turned on when a voltage level of $V_{N11}$ is Vdd=3.3 volts, a voltage drop of about 1 volt occurs at both ends of a load RL so that the output voltage level falls from about 3.3 volts to about 2.3 volts. Thus, the operation region of the thirteenth NMOS transistor M13 is changed from the saturation region to the active region.

Since the thirteenth NMOS transistor M13 is operated in the saturation region in the case where the output voltage is $V_P > 2.6$ (=3.3V−0.7V), the output impedance of the differential switch is represented by the following expression 16.

$$Z_{out,sat} = g_{m13} \times r_{o13} \times g_{m12} \times r_{o12} \times r_{o11} \qquad \text{<Expression 16>}$$

In the expression 16, $g_{m13}$, $r_{o13}$, $g_{m12}$, $r_{o12}$ and $r_{o11}$ represent a transconductance of the thirteenth NMOS transistor M13, the output impedance of the thirteenth NMOS transistor M13, a transconductance of the twelfth NMOS transistor M12, an output impedance of the twelfth NMOS transistor M12 and an output impedance of the eleventh NMOS transistor M11, respectively.

However, since the thirteenth NMOS transistor M13 is operated in the active region in the case where $2.3V < V_p \leq 2.6V$, the output impedance of the differential switch is represented by the following expression 17.

$$Z_{out,lin} = g_{m12} \times r_{o12} \times r_{o11} + R_{on13}$$ <Expression 17>

In expression 17, $R_{on13}$ indicates a turn-on resistance between the source and the drain of the thirteenth NMOS transistor M13 in the active region.

As a result, the output impedance decreases and the output current varies due to change of the operation region of the thirteenth NMOS transistor M13 into the active region, thereby lowering accuracy of the output voltage $V_p$.

Therefore, the voltage level $V_{N1}$ satisfies a turn-on condition of the thirteenth NMOS transistor M13 so that the thirteenth NMOS transistor M13 is operated in the saturation region without concern over the variation of the output voltage $V_p$.

When the thirteenth NMOS transistor M13 is turned on, the third and fourth dynamic inverters DINV3 and DINV4 are provided so as to maintain the voltage level of $V_{N11}$ over a certain value.

In the third dynamic inverter DINV3, the fifteenth NMOS transistor M15 and the seventeenth NMOS transistor M17 are turned on and the sixteenth NMOS transistor M16 is turned off when the thirteenth NMOS transistor M13 is turned off. Also, when the thirteenth NMOS transistor M13 is turned on, the fifteenth NMOS transistor M15 is turned off and the sixteenth and seventeenth PMOS transistors M16 and M17 are turned on. Thus, the voltage level $V_{N1}$ of the node N11 rises to the voltage level $V_{dd}$, and then the voltage level $V_{N11}$ of the node N11 is maintained at the certain value because the seventeenth PMOS transistor M17 is turned off due to a weak inversion state when the voltage level $V_{N11}$ rises over the threshold voltage of the seventeenth PMOS transistor M17.

Thus, the NMOS differential switch, like the PMOS differential switch described above, may also enhance the output impedance. In addition, the advantage of the CMOS capacitor shown in FIG. 10 as applied to the PMOS embodiment applies equally well to the NMOS embodiment of FIG. 11.

According to the present invention, the differential switch includes a dynamic inverter such that the switching transistor is operated in the saturation region without concern for the output voltage, thereby enhancing the output impedance of the device. Furthermore, the differential switch may minimize the variation of the output current in accordance with enhancement of the output impedance, to thereby improve accuracy of the DAC and reduce the chip size thereof.

While this invention has been particularly shown and described with references to preferred embodiments thereof, it will be understood by those skilled in the art that various changes in form and detail may be made herein without departing from the spirit and scope of the invention as defined by the appended claims.

What is claimed is:

1. A dynamic inverter comprising:
    a first transistor directly coupled between a first power voltage and an output node, and configured to receive an input signal through a control electrode thereof;
    a second transistor coupled between the output node and a connection node, and configured to receive the input signal through a control electrode thereof, the first transistor and the second transistor being directly coupled to the output node; and
    a third transistor coupled between the connection node and a second power voltage, a control electrode of the third transistor being directly coupled to the output node, a single current path being provided between the connection node and the second power voltage solely through the third transistor.

2. The dynamic inverter of claim 1, wherein a voltage level at the output node is maintained at a substantially constant level between the first power voltage and the second power voltage in response to the third transistor being in a disabled state while a voltage level of the input signal is varied.

3. The dynamic inverter of claim 1, wherein the first transistor is a PMOS transistor, and each of the second and third transistors is an NMOS transistor.

4. The dynamic inverter of claim 3, wherein a voltage level at the output node is maintained at a constant level at a time point when the third transistor is turned off and the voltage level of the input signal is increased.

5. The dynamic inverter of claim 4, wherein the constant level is controlled by adjusting a threshold voltage of the third transistor.

6. The dynamic inverter of claim 1, further comprising a MOS capacitor coupled between the first power voltage and the output node and configured to prevent an electric potential at the output node from being lowered due to a leakage current when a frequency of the input signal is lower than a predetermined frequency.

7. The dynamic inverter of claim 1, wherein the first transistor is an NMOS transistor, and each of the second and third transistors is a PMOS transistor.

8. The dynamic inverter of claim 7, wherein the voltage level at the output node is maintained at a constant level at a time point when the third transistor is turned off and the voltage level of the input signal is decreased.

9. The dynamic inverter of claim 8, wherein the substantially constant level is controlled by adjusting a threshold voltage of the third transistor.

10. A dynamic inverter comprising:
    a first transistor coupled between a first power voltage and an output node, and configured to receive an input signal through a control electrode thereof;
    a second transistor coupled between the output node and a connection node, and configured to receive the input signal through a control electrode thereof;
    a third transistor coupled between the connection node and a second power voltage, a control electrode of the third transistor being coupled to the output node; and
    a MOS capacitor coupled between the first power voltage and the output node and configured to prevent an electric potential at the output node from being lowered due to a leakage current when a frequency of the input signal is lower than a predetermined frequency.

* * * * *